United States Patent [19]

Anthony et al.

[11] 3,988,769

[45] Oct. 26, 1976

[54] HIGH VOLTAGE DIODES

[75] Inventors: Thomas R. Anthony; Harvey E. Cline, both of Schenectady, N.Y.

[73] Assignee: General Electric Company, Schenectady, N.Y.

[22] Filed: Mar. 10, 1975

[21] Appl. No.: 556,728

Related U.S. Application Data

[63] Continuation of Ser. No. 411,007, Oct. 30, 1973, abandoned.

[52] U.S. Cl. .................................... 357/60; 357/33; 357/76; 148/1.5
[51] Int. Cl.² .................. H01L 29/00; H01L 29/04; H01L 23/32; H01L 7/00
[58] Field of Search .................. 357/60, 33, 76, 89, 357/90; 148/1.5

[56] References Cited
UNITED STATES PATENTS 3,503,125   3/1970   Haberecht ........................... 357/60

Primary Examiner—Edward J. Wojciechowicz
Attorney, Agent, or Firm—Donald M. Winegar; Joseph T. Cohen; Jerome C. Squillaro

[57] ABSTRACT

A high voltage diode has a lamellar structured body of semiconductor material. The lamellar structure is produced by the thermal gradient zone melting process method of thermo migrating metal "wires" through the body to form a plurality of spaced regions of conductivity opposite to that of the body. The material of the spaced regions is recrystallized semiconductor material of the body having solid solubility of an impurity dopant therein thereby being suitably doped to form a selected type conductivity and resistivity. The resulting structure is a plurality of integral diodes connected in a series electrical circuit arrangement.

12 Claims, 5 Drawing Figures

U.S. Patent    Oct. 26, 1976    3,988,769

HIGH VOLTAGE DIODES

This is a continuation of application Ser. No. 411,007, filed Oct. 30, 1973, now abandoned.

DESCRIPTION OF THE PRIOR ART

1. Field of the Invention

This invention relates to high voltage semiconductor diodes and, in particular, to integral high voltage diodes and a method of producing the same.

2. Discussion of the Prior Art

Heretofore, when a need for a plurality of high voltage series connected diodes arose, a plurality of individual high voltage diodes were physically connected together in a series circuit arrangement. An integral arrangement of series connected diodes was somewhat impractical since fabrication times were excessive and double diffusion processing techniques were required to achieve the desired structure. The diffusion process employed inherently resulted in P-N junctions which were not sharply defined and regions of conductivity having a non-uniform level of resistivity throughout the regions.

An object of this invention is to provide a new and improved arrangement of series-connected high voltage semiconductor diodes which overcome the deficiencies of the prior art.

Another object of this invention is to provide a new and improved arrangement of series-connected high voltage diodes comprising a plurality of diodes formed in the same body of semiconductor material.

Another object of this invention is to provide a new and improved arrangement of series-connected high voltage semiconductor diodes wherein one region of each diode is recrystallized material of the body having a sufficient dopant impurity therein to impart a selected type of conductivity and a resistivity to the region.

Other objects will, in part, be obvious and will, in part, appear hereinafter.

In accordance with the teachings of this invention there is provided a high voltage semiconductor diode comprising a body of semiconductor material having two major opposed end surfaces and a lamellar structure of alternate first and second regions of different and opposite type conductivity. The lamellar structure is so arranged as to provide a plurality of integral diodes connected in a series electrical circuit. Each diode has a first and a second region of opposite type conductivity. The first region of one diode has a surface area coextensive with one of the two opposed end surfaces of the body. A second region of another diode has a surface area coextensive with the other opposed end surface of the body. Each of the first regions has a first type conductivity and a selected resistivity. The material of the second regions is recrystallized material of the first regions and includes a sufficient quantity of a dopant material to impart a second and opposite type conductivity thereto. Each of a plurality of first P-N junctions is formed by the contiguous surfaces of each pair of first and second regions of opposite type conductivity of each diode. Each of a plurality of second P-N junctions is formed by the contiguous surfaces of the regions of opposite type conductivity of mutually adjacent integral diodes. Electrical contacts are affixed to and are in an electrical conductive relationship with the respective major opposed end surfaces of the body. Suitable means such, for example, as an electrical contact, shunts each second P-N junction between each pair of mutually adjacent diodes. The resulting device is a plurality of integral diodes arranged in a series circuit with each other thereby forming a high voltage diode.

DESCRIPTION OF THE INVENTION

Figure 1:
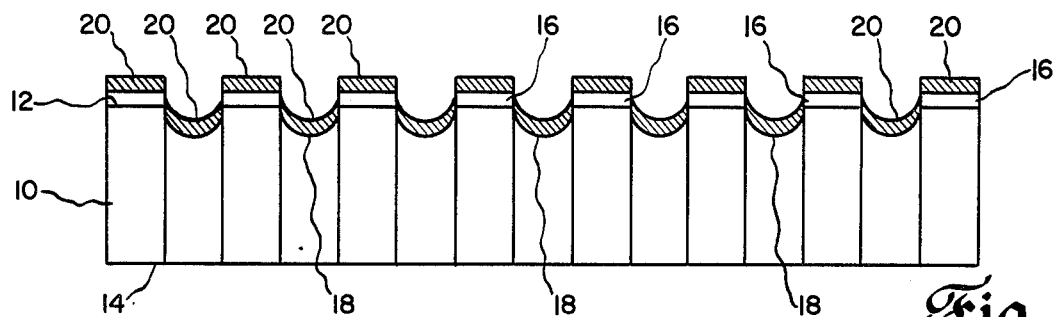
FIGS. 1, 2 and 3 are elevation views, in cross-section, of a body of semiconductor material processed in accordance with the teachings of this invention.

With reference to FIG. 1, there is shown a body 10 of semiconductor material having a selected resistivity and a first type conductivity. The body 10 has opposed major surfaces 12 and 14 which are the top and bottom surfaces respectively thereof. The semiconductor material comprising the body 10 may be silicon, germanium, silicon carbide, a semiconductor compound of a Group II element and a Group VI element and a semiconductor compound of a Group III and a Group V element. In order to describe the invention more fully the body 10 is said to be of silicon semiconductor material.

The body 10 of silicon is mechanically polished, chemically etched to remove any damaged surfaces, rinsed in deionized water and dried in air. An acid resistant mask 16 is disposed on the surface 12 of the body 10. Preferably, the mask is of silicon oxide which is either thermally grown or vapor deposited on the surface 12 by any of the methods well known to those skilled in the art. Employing well known photolithographical techniques, a photoresist, such, for example, as Kodak Metal Etch Resist, is disposed on the surface of the silicon oxide layer 16. The resist is dried by baking at a temperature of about 80° C. A suitable mask of spaced lines of a predetermined thickness and spaced a predetermined distance apart is disposed on the layer of photoresist and exposed to ultraviolet light. After exposure, the layer of photoresist is washed in Xylene to open windows in the mask where the lines are desired so as to be able to selectively etch the silicon oxide layer 16 exposed in the windows.

Selective etching of the layer 16 of silicon oxide is accomplished with a buffered hydrofluoric acid solution (NH$_4$F—HF). The etching is continued until a second set of windows corresponding to the windows of the photoresist mask are opened in the layer 16 of silicon oxide to expose selective portions of the surface 12 of the body 10 of silicon. The processed body 10 is rinsed in deionized water and dried. The remainder of the photoresist mask is removed by immersion in concentrated sulphuric acid at 180° C or immersion in a mixture of 1 part by volume hydrogen peroxide and 1 part by volume concentrated sulphuric acid.

Selective etching of the exposed surface areas of the body 10 is accomplished with a mixed acid solution. The mixed acid solution is 10 parts by volume nitric acid, 70%, 4 parts by volume acetic acid, 100%, and 1 part by volume hydrofluoric acid, 48%. At a temperature of from 20° to 30° C, the mixed acid solution selectively etches the silicon of the body 10 at a rate of approximately 5 microns per minute. A trough 18 is etched in the surface 12 of the body 10 beneath each window of the oxide layer 16. The selective etching is continued until the depth of the trough 18 is approximately equal to the width of the window in the silicon oxide layer 16. However, it has been discovered, that the trough 18 should not be greater than approximately 100 microns in depth because undercutting of the silicon oxide layer 16 will occur. Undercutting of the layer 16 of silicon oxide has a detrimental effect on the width of the metal "wire" to be migrated through the body 10. Etching for approximately 5 minutes at a temperature of 25° C will result in a trough 18 of from 25 to 30 microns in depth for a window width of from 10 to 500 microns. The etched body 10 is rinsed in distilled water and blown dry. Preferably, a gas such, for example, as freon, argon and the like is suitable for drying the processed body 10.

The processed body 10 is disposed in a metal evaporation chamber. A metal layer 20 is deposited on the remaining portions of the layer 16 of silicon oxide and on the exposed silicon in the troughs 18. The metal in the troughs 18 are the metal wires to be migrated through the body 10. The metal of the layer 20 comprises a material, either substantially pure in itself or suitably doped by one or more materials to impart a second and opposite type conductivity to material of the body 10 through which it migrates. The thickness of the layer 20 is approximately equal to the depth of the trough 18. Therefore, if the trough 18 is 20 microns deep, the layer 20 is approximately 20 microns in thickness. A suitable material for the metal layer 20 is aluminum to obtain P-type regions in N-type silicon semiconductor material. Prior to migrating the metal wires in the troughs 18 through the body of silicon 10, the excess metal of the layer 20 is removed from the silicon oxide layer 16 by such suitable means as grinding away the excess metal with 600 grit carbide paper.

It has been discovered that the vapor deposition of the layer 20 of aluminum metal should be performed at a pressure of approximately $1 \times 10^{-5}$ torr but not greater than $3 \times 10^{-5}$ torr. When the pressure is greater than $3 \times 10^{-5}$ torr, we have found that in the case of aluminum metal deposited in the troughs 18, the aluminum does not penetrate into the silicon and migrate through the body 10. It is believed that the layer of aluminum is saturated with oxygen, which prevents reduction of a thin layer of silicon oxide, formed when the silicon surface is exposed to air, by the aluminum and thus, prevents a good wetting of the contiguous surfaces of silicon. The initial melting and alloying of aluminum with silicon required for migration is not obtained because of the inability of aluminum atoms to diffuse into the silicon interface. In a like manner, aluminum deposited by sputtering is not as desirable because sputtered aluminum appears to be saturated with oxygen. The preferred methods of depositing aluminum on the silicon body 10 are by the electron beam method and the like wherein little, if any, oxygen can be trapped in the aluminum.

The processed body 10 is placed in a thermomigration apparatus, not shown, and the metal wires in the troughs 18 are migrated through the body 10 by a thermal gradient zone melting process. A thermal gradient of approximately 50° C per centimeter between the bottom surface 14, which is the hot face, and the surface 12, which is the cold face, has been discovered to be appropriate for an average temperature of the body 10 from 700° to 1350° C. The process is practiced for a sufficient length of time to migrate all the metal wires through the body 10. For example, for aluminum wires of 20 microns thickness, a thermal gradient of 50° C/cm, a temperature of the body 10 of 1100° C, and a pressure of $1 \times 10^{-5}$ torr, a furnace time of less than 12 hours is required to migrate the wires through a silicon body 10 of 1 centimeter thickness.

The temperature gradient zone melting process and apparatus therefore is not a part of this invention. For a more thorough understanding of the temperature gradient zone melting process employed in this invention and for a more thorough description of the apparatus employed for the process, one is directed to our copending applications entitled Method of Making Deep Diode Devices, U.S. Pat. No. 3,901,736; Deep Diode Device Production and Method, Ser. No. 411,021; Deep Diode Devices and Method of Apparatus, Ser. No. 411,001, now abandoned in favor of Ser. No. 552,154; High Velocity Thermomigration Method of Making Deep Diodes, U.S. Pat. No. 3,898,106; Deep Diode Device Having Dislocation-Free P-N Junctions and Method, U.S. Pat. No. 3,902,925; and The Stabilized Droplet Method of Making Deep Diodes Having Uniform Electrical Properties, U.S. Pat. No. 3,899,361, filed concurrently with this patent application and assigned to the same assignee of this invention.

Figure 2:
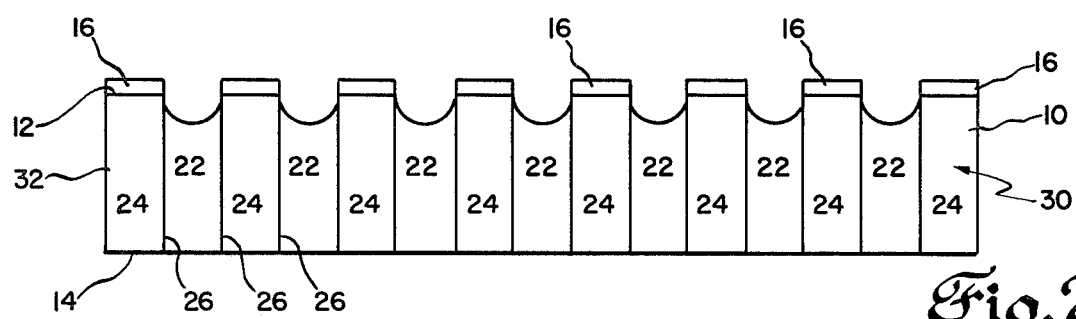

Upon completion of the temperature gradient zone melting process, the aluminum wires which have migrated through the body 10 onto the surface 14 are removed by selective etching or grinding. The resulting processed body 10 is as shown in FIG. 2. The thermal migration of the metal wires in the troughs 18 through the body 10 produces a body 10 having a lamellar structure of a plurality of spaced regions 22 of a second and opposite type conductivity than the body 10. Each region 22 is recrystallized material of the body 10 suitably doped with a material comprising the metal wire and having an impurity concentration sufficient to obtain the desired conductivity. The metal retained in the recrystallized region is the maximum allowed by the crystalline structure of the material through which it has migrated. It is semiconductor material with a maximum solid solubility of the impurity therein. It is not semiconductor material which has eutectic material therein, and it is not an alloy of the impurity and the semiconductor materials. The region 22 has a constant uniform level of impurity concentration throughout the entire planar region. The thickness of the region 22 is substantially constant for the entire region. The peripheral surface of each planar region 22 comprises in part the top surface 12, the bottom surface 14 and the peripheral side surfaces 30 and 32 of the body 10.

Additionally, the body 10 is divided into a plurality of spaced regions 24 having the same or first type conductivity as the body 10. A P-N junction 26 is formed by the contiguous surfaces of each pair of mutually adjacent regions 22 and 24 of opposite type conductivity. At a 1100° C processing temperature, the number of acceptors decreases from $2 \times 10^{19}$ to $5 \times 10^{14}$, the concentration of donors in the N material, in a distance of 18 microns to form a P-N junction 26 which is abrupt and distinct. At lower processing temperatures the junction 26 is even more abrupt.

Figure 3:
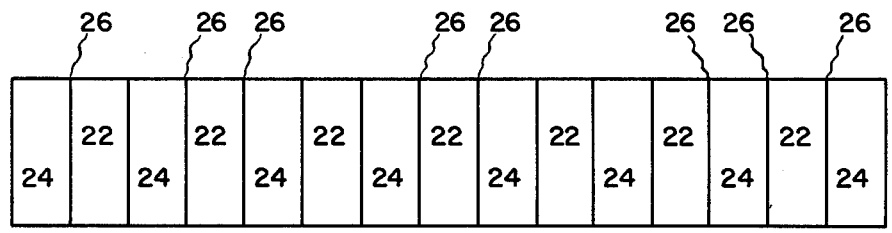

The resulting structure is one large area semiconductor device having a plurality of planar regions of alternate type conductivity as shown in FIG. 3. The structure may also be divided into a plurality of chips having a similar configuration.

Figure 4:
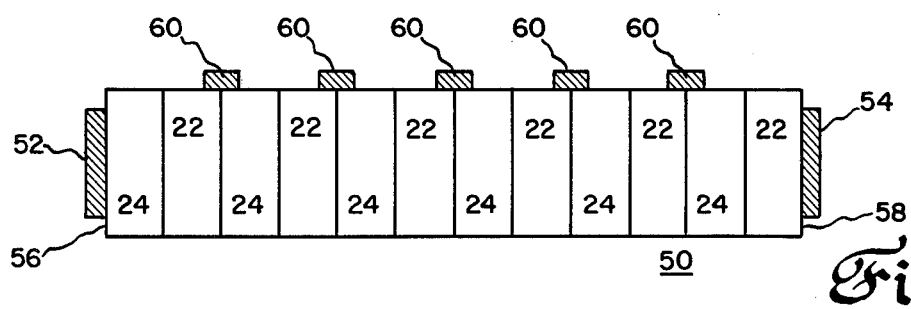
FIG. 4 is an elevation view, in cross-section, of a high voltage diode of this invention.
Figure 5:
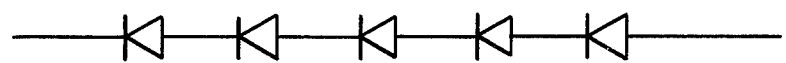
FIG. 5 is an electrical schematic of the high voltage diode of FIG. 5.

Referring now to FIG. 4, there is shown a high voltage diode 50 embodying the processed body 10 and its lamellar structure. Those items denoted by the same reference numbers as those of the processed body 10 are the same, and function in the same manner, as the corresponding items of FIGS. 2 and 3. Electrical contacts 52 and 54 are affixed to respective opposed major surfaces 56 and 58 of the diode 50. Employing suitable photolithographical techniques and metal deposition means known to those skilled in the art, a plurality of electrical contacts 60 are affixed to selective surface areas of mutually adjacent first and second regions 24 and 22, respectively, by such suitable means as alloying, and in electrically conductive relationship therewith, so as to electrically shunt the P-N junction therebetween. The resulting high voltage diode is a body of semiconductor material having lamellar structure wherein the P-N junction between mutually adjacent diodes is electrically shunted by the contact 60 to produce an integral series connected diode array. Other means may also be employed to shunt the P-N junction such, as for example, as by an electrical wire lead affixed to the two regions which form the P-N junction. The equivalent series circuit arrangement of the integral high voltage diode array is shown schematically in FIG. 5.

As an example of the teachings of this invention, a high voltage diode 50 was constructed wherein the semiconductor material of the body 10 was N-type conductivity and had a resistivity of 10 ohms-centimeter. Aluminum wires were migrated through the body 10 to form regions 22 of P-type conductivity having a resistivity of $8 \times 10^{-3}$ ohm-centimeter. The thickness of the regions 22 and 24 were each 10 mils. The material of the electrical contacts 52, 54 and 60 was an alloy of 3% by weight antimony and the remainder gold melted into the body 10 and alloyed with selected surface areas spanning the P-N junction 26 therebetween. The resulting high voltage diode had a breakdown voltage of from 500 to 600 volts per diode and of 25,000 volts per inch.

The excellent electrical characteristics of the high voltage diode 50 is achieved because of the very sharp and clearly defined P-N junction 26 produced by the migration of the metal wires by the thermal gradient zone melting process through the body 10. At a process temperatuure of 1100° C concentration gradients associated with the P-N junction 26 are only approximately 18 micron wide. The process also is a cleansing process as it cleans impurities from the material of the region 22 by substantially a zone refining process. Substantially theoretical electrical characteristics are achieved for the materials utilized in making the diode 50. The resistivity of the P-type conductivity regions 22 was substantially uniform over the entire region and exhibited the theoretical physical values expected for recrystallized silicon material of $8 \times 10^{-3}$ ohm-centimeter resistivity with a solid solubility concentration of aluminum as an impurity of approximately $2 \times 10^{19}$ atoms per cc. The recrystallized P-type conductivity regions 22 had a lower defect and dislocation density than the parent material of regions 24. The P-N junctions 26 contained no dislocations or other defects visible either by election or infrared microscopy.

The invention has been described relative to practicing thermal gradient zone melting in a negative atmosphere. However, it has been discovered that when the body of semiconductor material is a thin wafer of the order of 10 mil thickness, the thermal gradient zone melting process may be practiced in an inert gaseous atmosphere of hydrogen, helium, argon and the like in a furnace having a positive atmosphere.

The thermomigration of metal wires is preferably practiced in accordance with the planar orientations, thermomigration directions, stable wire directions and stable wire sizes of Table I.

Table I

| Wafer Plane | Migration Direction | Stable Wire Directions | Stable Wire Sizes |
|---|---|---|---|
| 100 | <100> | <011>* | <100 microns |
|  |  | <0$\bar{1}$1>* | <100 microns |
| (110) | <110> | <1$\bar{1}$0>* | <150 microns |
| (111) | <111> | (a) <01$\bar{1}$> | |
|  |  | <10$\bar{1}$> | <500 microns |
|  |  | <1$\bar{1}$0> | |
|  |  | (b) <11$\bar{2}$>* | |
|  |  | <$\bar{2}$11>* | <500 microns |
|  |  | <1$\bar{2}$1>* | |
|  |  | (c) Any other * Direction in (111) plane* | <500 microns |

*The stability of the migrating wire is sensitive to the alignment of the thermal gradient with the <100>, <110> and <111> axis, respectively.
+Group a is more stable than group b which is more stable than group c.

We claim as our invention:
1. A high voltage semiconductor diode comprising:
   a body of semiconductor material having
      a predetermined first type conductivity and a predetermined level of resistivity;
      two major opposed end surfaces;
      a pair of opposed major surfaces, at least one of the surfaces having a preferred planar crystal orientation which is one selected from the group consisting of (111), (110) and (100);
      a preferred vertical axis which is perpendicular to the surface having the preferred planar crystal orientation and substantially parallel with a first crystal axis;
      a lamellar structure of alternate first and second planar regions of different and opposite type conductivity formed in situ in the body substantially perpendicular to the surface having the preferred planar crystal orientation and so arranged as to provide a plurality of integral diodes connected in a series electrical circuit,
      each diode having a first and a second region of opposite type conductivity in abutting contact relationship with each other,
      a first region of one diode having a surface area coextensive with one of the opposed end surfaces of the body,
      a second region of another diode having a surface area coextensive with the other of the opposed end surfaces of the body,
      the material of each of the first regions consisting of the material of the body,
      each of the second regions consisting of recrystallized semiconductor material of the body, the recrystallized semiconductor material having a lower defect and dislocation density than the semiconductor material of the body, and having a predetermined level of concentration of a dopant impurity material therein to impart a predetermined type conductivity to the second region opposite to that of the first region, each of the second regions being oriented substantially parallel with a second preferred crystal axis of the material of the body;

each of the second regions being formed in situ in the body by the migration of a melt of metal-rich semiconductor material of the body through the entire body from one opposed major surface to the other, by thermal gradient zone melting at a predetermined elevated temperature along a thermal gradient substantially parallel with the first preferred crystal axis and the vertical axis of the body which produces the recrystallized semiconductor material of each second region having the predetermined level of concentration of the dopant impurity material therein as determined by the solid solubility limit of the metal of the melt, comprising the dopant impurity material, in that semiconductor material of the body at that predetermined elevated temperature of migration and the metal is distributed substantially uniformly throughout the entire second region;

each of the second regions having a substantially constant level of impurity material concentration and a substantially constant thickness throughout the region;

a plurality of first P-N junctions, each first P-N junction being formed by the contiguous surfaces of each pair of first and second regions of opposite type conductivity of each diode;

a plurality of second P-N junctions, each second P-N junction being formed by the contiguous surfaces of the abutting regions of opposite type conductivity of mutually adjacent integral diodes;

each of the first and second P-N junctions being substantially free of defects and being substantially perpendicular to the surface of preferred planar crystal orientation;

a first electrical contact affixed to, and in an electrically conductive relationship with, one of the opposed end surfaces of the body;

a second electrical contact affixed to, and in an electrically conductive relationship with, the other of the opposed end surfaces of the body, and means for electrically shunting each second P-N junction.

2. The semiconductor device of claim 1 wherein the material of the body is one selected from the group consisting of silicon, silicon carbide, germanium and gallium arsenide.

3. The semiconductor device of claim 1 wherein the preferred planar crystal orientation is (100) and the second preferred crystal axis is one selected from the group consisting of $< 011 >$ and $< 0\bar{1}1 >$.

4. The semiconductor device of claim 3 wherein the semiconductor material of the body is one selected from the group consisting of silicon, germanium, silicon carbide and gallium arsenide.

5. The semiconductor device of claim 1 wherein the preferred planar crystal orientation is (110) and the second preferred crystal axis is $< 1\bar{1}0 >$.

6. The semiconductor device of claim 5 wherein the material of the body is silicon, silicon carbide, germanium and gallium arsenide.

7. The semiconductor device of claim 1 wherein the preferred planar crystal orientation is (111) and the second preferred crystal axis is one selected from the group consisting of $< 01\bar{1} >$, $< 10\bar{1} >$, $< 1\bar{1}0 >$, $< 11\bar{2} >$, $< \bar{2}11 >$ and $< 1\bar{2}1 >$.

8. The semiconductor device of claim 7 wherein the material of the body is one selected from the group consisting of silicon, silicon carbide, germanium and gallium arsenide.

9. The high voltage semiconductor diode of claim 2 wherein
the semiconductor material is silicon having N-type conductivity and the dopant impurity material is aluminum.

10. The high voltage semiconductor diode of claim 9 wherein
the silicon has a selected resistivity of 10 ohm-centimeter and the impurity concentration of the aluminum is $2 \times 10^{19}$ atoms per cubic centimeter.

11. The high voltage semiconductor diode of claim 1 wherein
each P-N junction is a step junction with associated concentration gradients having a width of approximately 18 microns.

12. The high voltage semiconductor diode of claim 1 wherein
the means for shunting the second P-N junction is a plurality of third electrical contacts, each of the contacts being affixed to, and in electrically conductive relationship with a selected area of first and second regions of opposite type conductivity of mutually adjacent diodes and the second P-N junction therebetween to electrically shunt the second P-N junction to electrically connect the integral plurality of diodes into the series electrical circuit arrangement.

* * * * *